United States Patent [19]
Furlan

[11] Patent Number: 6,099,161
[45] Date of Patent: Aug. 8, 2000

[54] ASYNCHRONOUS ANALOG OR DIGITAL FREQUENCY MEASUREMENT ON DIGITAL TEST EQUIPMENT

[75] Inventor: Igor Furlan, San Jose, Calif.

[73] Assignee: Zilog, Inc., Campbell, Calif.

[21] Appl. No.: 08/577,607

[22] Filed: Dec. 22, 1995

[51] Int. Cl.[7] .................................................. G06F 11/00
[52] U.S. Cl. ....................................... 371/27; 395/183.01
[58] Field of Search .............................. 371/27, 21, 25.1, 371/26; 395/183.01

[56] References Cited

U.S. PATENT DOCUMENTS 5,519,879  5/1996  Carmon ................................... 395/800

Primary Examiner—Vincent P. Canney
Attorney, Agent, or Firm—Majestic, Parsons, Siebert & Hsue

[57] ABSTRACT

A method for use with digital automated test equipment for measuring an asynchronous analog frequency, which analog frequency may be up to at least four times the operational frequency of the digital automated test equipment. From test vectors related to the frequency of interest known to represent good components, a pattern of test vectors with randomly assigned timing sets is created. Then, the maximum number of counts and the period increment is set. The selected pattern of test vectors are then applied to the unit under test and the received waveforms compared to the stored patterns. If there is no match, the period of the timing sets within the frequency range of interest is adjusted by a predetermined increment, and the test is repeated until there is a match. Since the period is now known, the frequency of the asynchronous analog signal can be calculated.

5 Claims, 5 Drawing Sheets

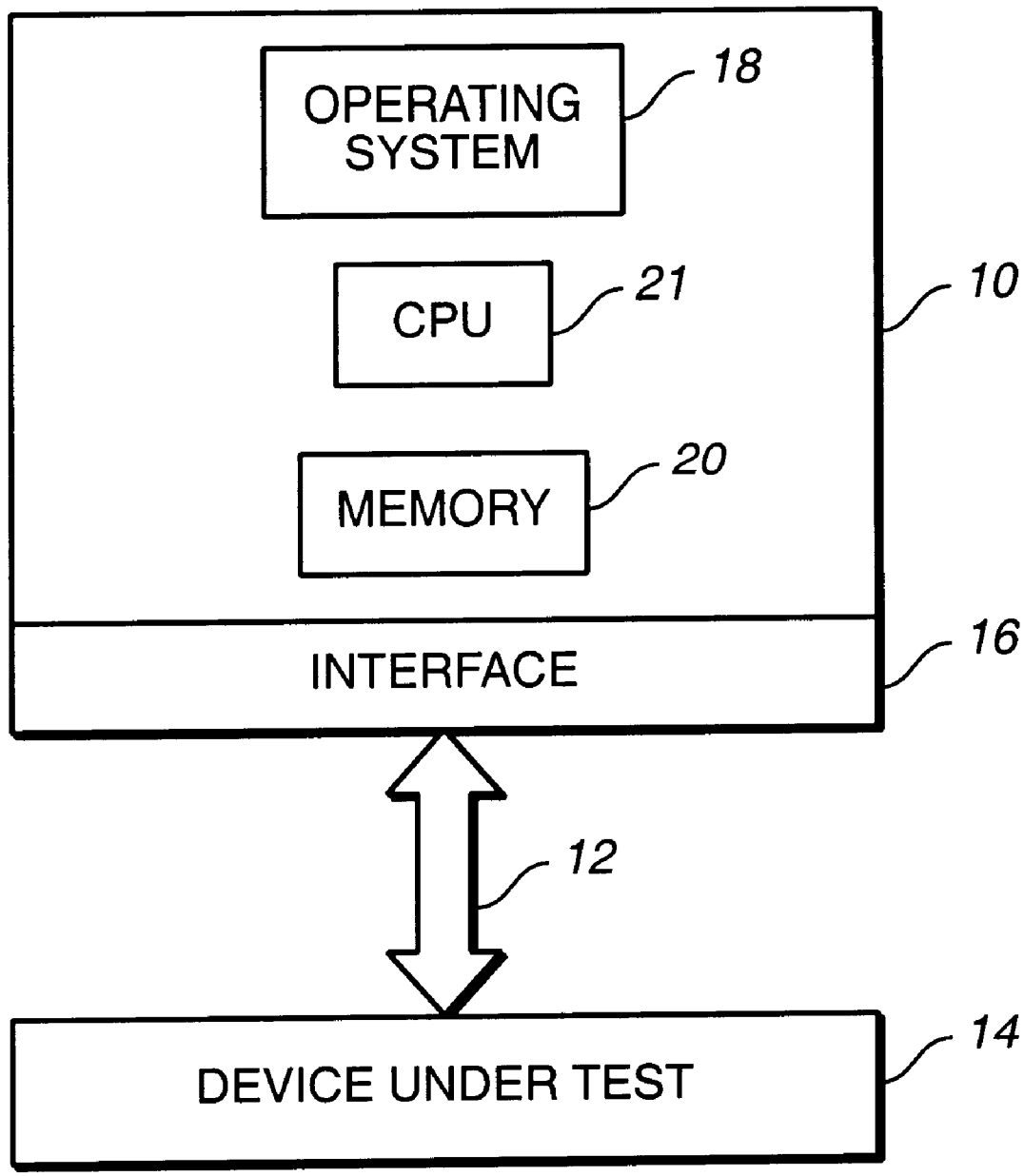
FIG._1

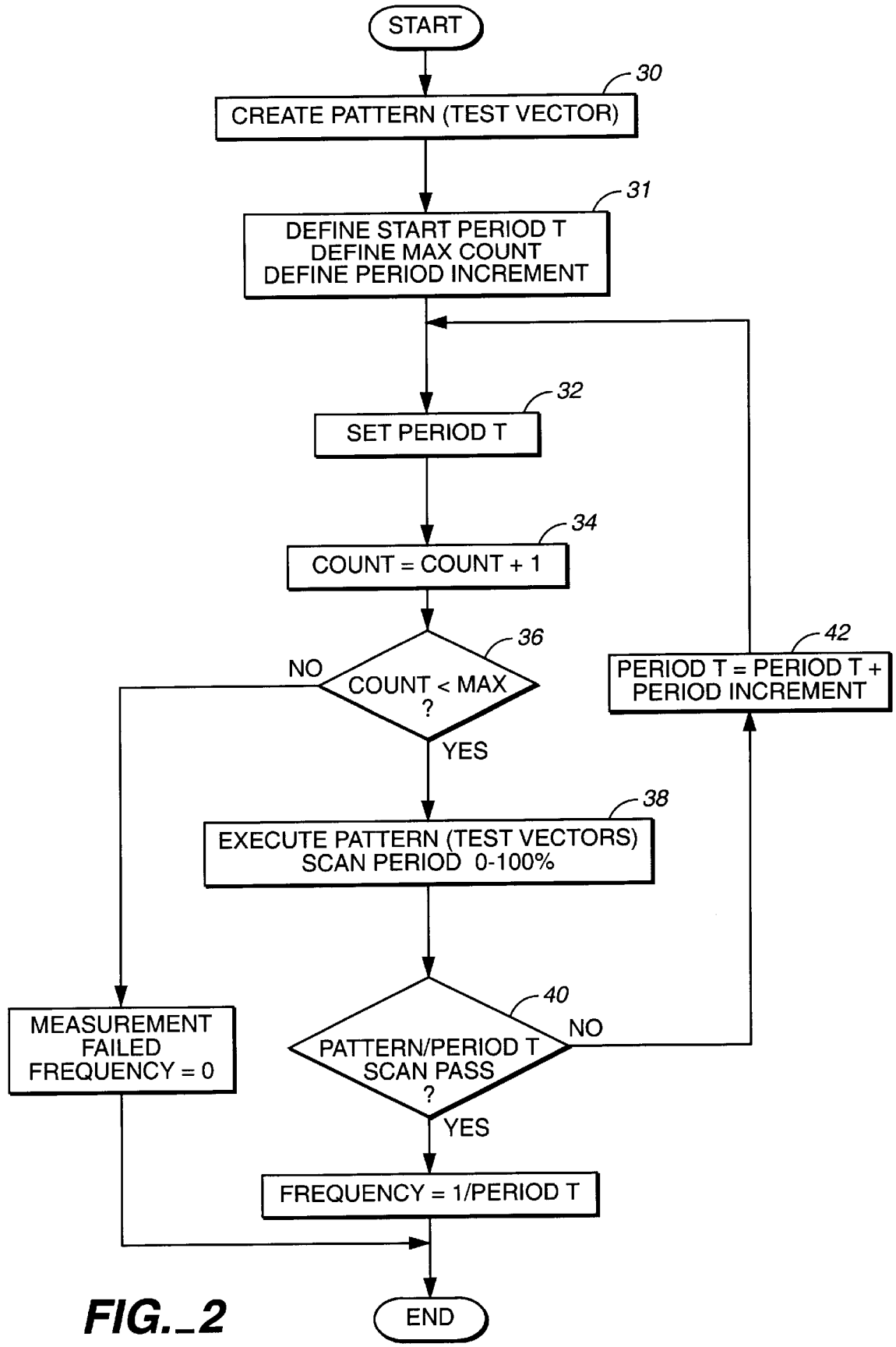
FIG._2

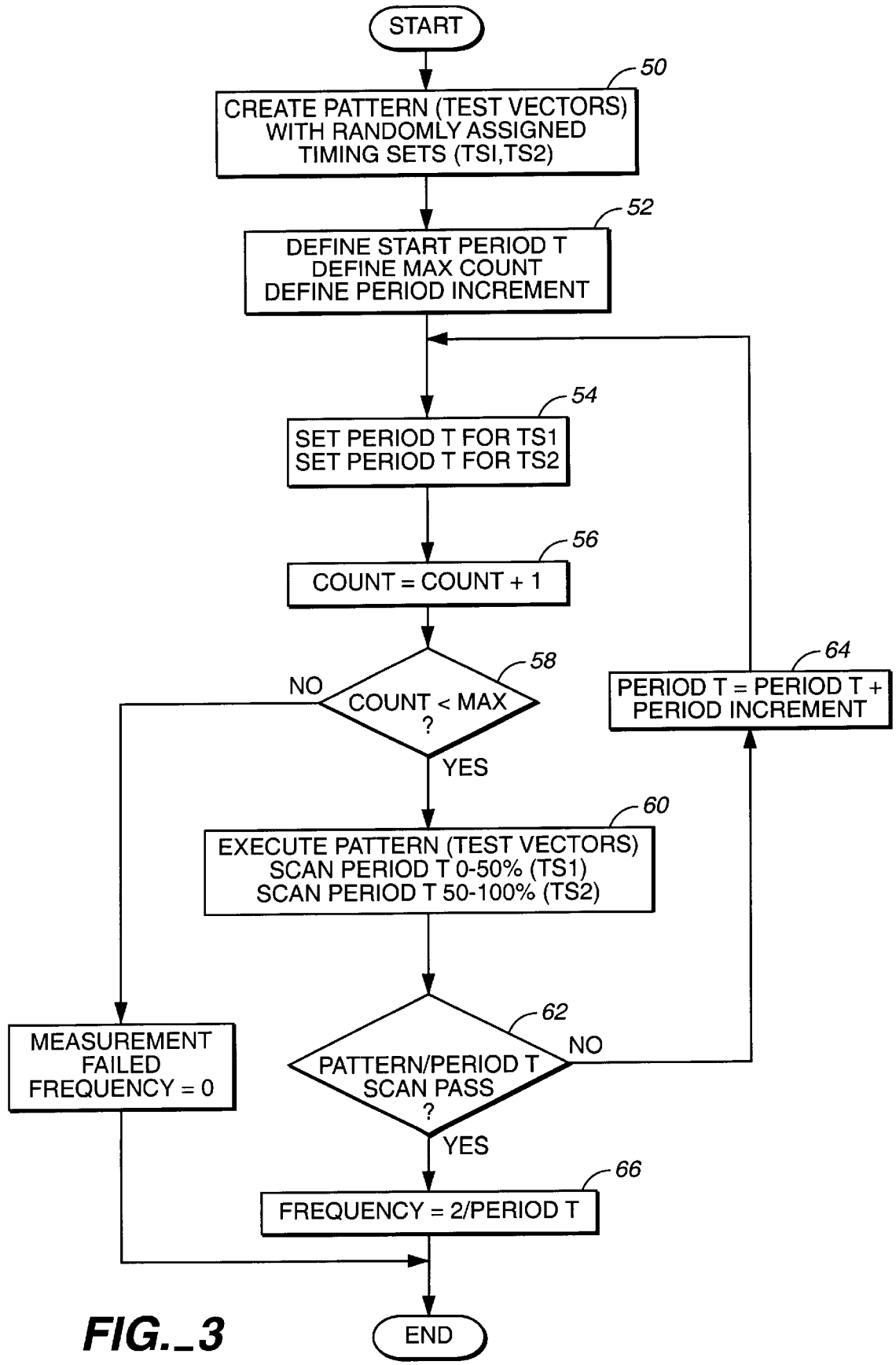
FIG._3

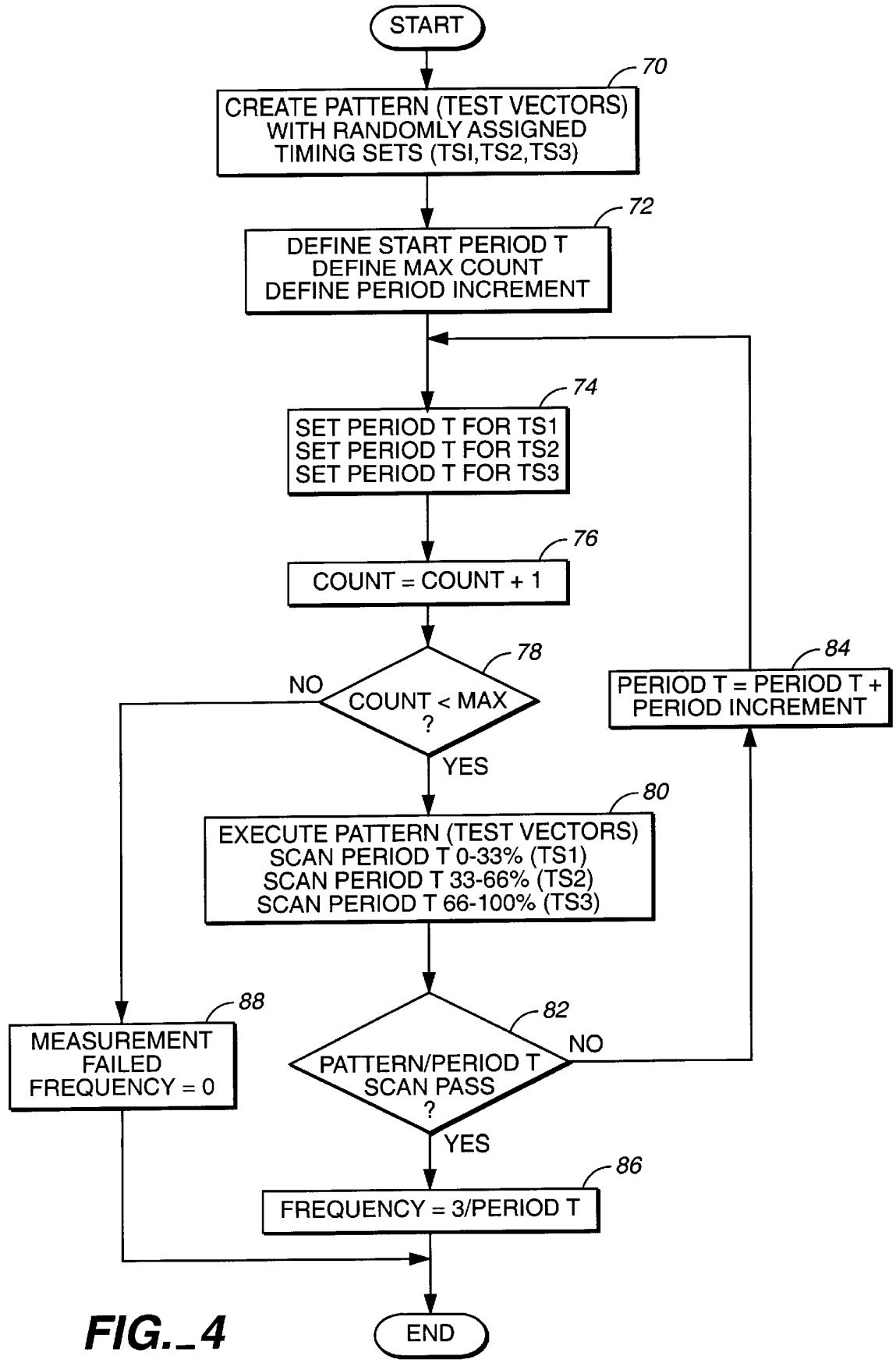
FIG._4

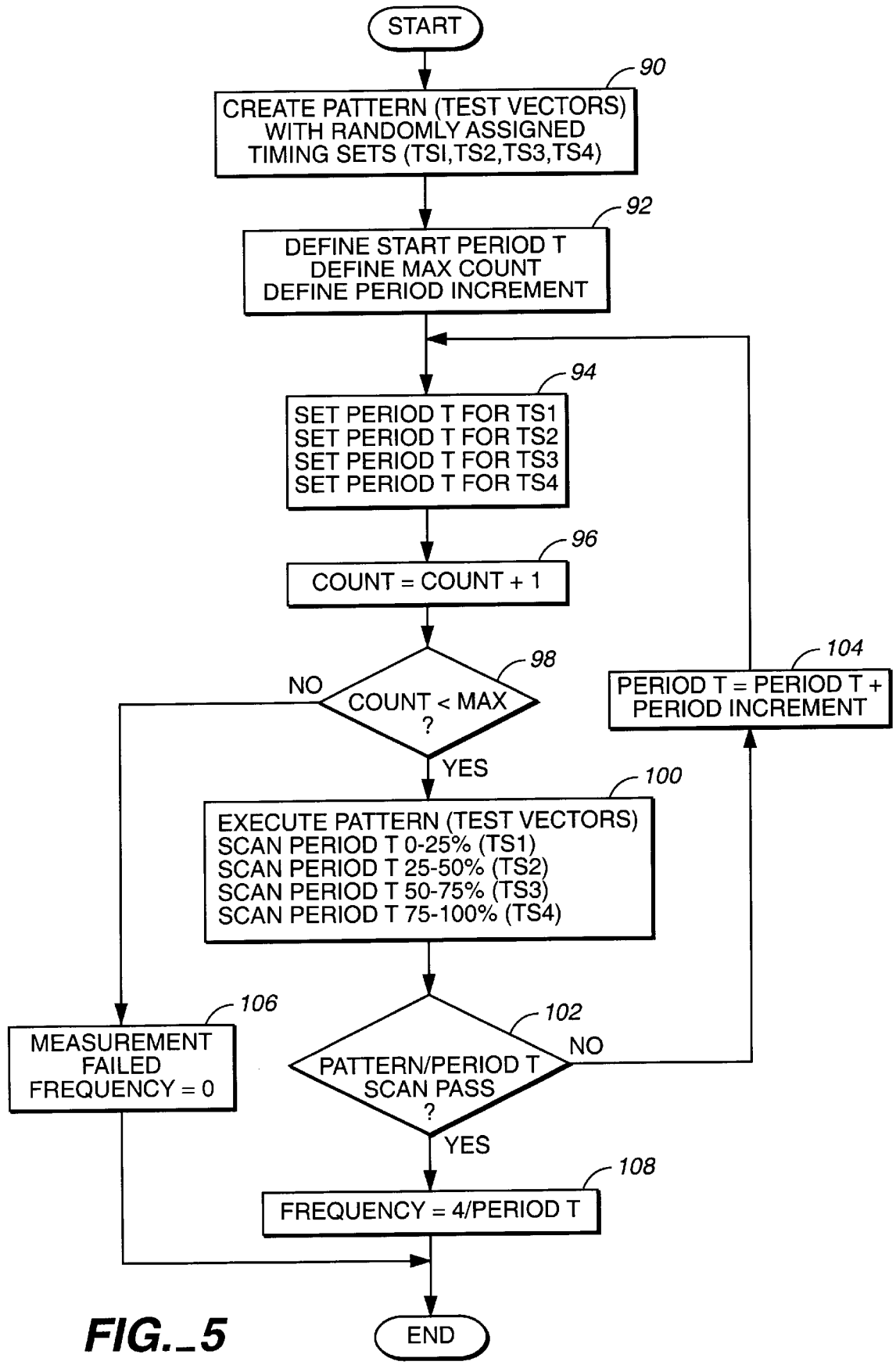
FIG._5

ASYNCHRONOUS ANALOG OR DIGITAL FREQUENCY MEASUREMENT ON DIGITAL TEST EQUIPMENT

TECHNICAL FIELD

The present invention relates to a novel frequency measuring procedure in a digital circuit tester, and more particularly, to a novel procedure for use in digital testing apparatus which is capable of measuring asynchronous analog or digital frequencies of up to at least four times the maximum ATE test frequency rate with no change in the accuracy rate.

BACKGROUND OF THE INVENTION

Automated test equipment (ATE) is generally known and is used to verify the operation of digital integrated circuits as well as analog integrated circuits. Generally, ATE designed specifically to test digital integrated circuits are not capable of measuring an analog frequency signal related to the device under test. ATE typically includes a test computer which is connected to the integrated circuit under test. A test program generates test signals or vectors and applies the signals in a pre-programmed sequence to the inputs of the device under test. The test computer then reads the output signals from the integrated circuit under test and compares the same with the stored patterns.

In the functional testing of integrated circuits digital patterns or vectors are applied to circuit inputs and the output signals measured and compared to stored values. A given input state for an integrated circuit should result in a particular output state. A truth table can be used to describe the digital transfer function and the correctness of the signal waveforms on all of the pins is an indication of proper operation of the device under test.

SUMMARY OF THE INVENTION

An object of the present invention is to provide a novel procedure for an automated test system that is performed a standard microcomputer and capable of measuring an asynchronous analog frequency which can be up to at least four times the maximum operational ATE frequency.

Another object of the present invention is to provide a novel procedure for an automated test system in which a phase-lock loop methodology is employed to measure the analog or digital frequency of a test signal from the integrated circuit under test.

Yet another object of the present invention is to provide a novel procedure for a digital automated test system which is used to measure an asynchronous analog or digital frequency from an integrated circuit. The measured frequency can be a multiple of the tester frequency rate and can be measured without adding additional hardware components to the automated test system.

These and other objects of the invention will become apparent from the description of the preferred embodiment.

BRIEF DESCRIPTION OF THE DRAWINGS

FIG. 1 is a high level block diagram of automated test equipment according to the present invention.

FIG. 2 is a flow diagram of a sequential test procedure according to the present invention wherein the unknown asynchronous frequency of the integrated circuit under is matched to the ATE test frequency.

FIG. 3 is a flow diagram of a sequential test procedure according to the present invention wherein the frequency of the device under test is twice that of the tester frequency.

FIG. 4 is a flow diagram of a sequential test procedure according to the present invention wherein the frequency of the integrated circuit under test is three times the tester frequency.

FIG. 5 is a flow diagram of a sequential test procedure according to the present invention where in the frequency of the integrated circuit under test is four times the tester frequency.

DETAILED DESCRIPTION OF THE PREFERRED EMBODIMENT

Referring to FIG. 1, a high level block diagram is seen of the automated test equipment. A test computer 10 is connected via a bidirectional data bus 12 to the device under test 14. As will be appreciated by those of ordinary skill, the bidirectional bus 12 will be understood to include power supply lines, a bidirectional data bus, a bidirectional address bus and appropriate control lines. Within the test computer 10, there are a number of well known elements such as interface 16, operating system 18 and a memory 20. As in any standard computer, a CPU 21 performs arithmatic operations, controls instruction processing, and provides timing signals. In conventional fashion such signals are presented through the interface 16, to the bus 12 and the device under test 14.

Within the device under test 14 is a means for driving each port or terminal of the integrated circuit being tested. The pin electronic circuits receive the voltages or currents and output circuitry identifies the magnitudes of output voltages or currents from the all of the ports. These measurements are returned to the test computer 10 where the test results are evaluated against known correct responses. If all of the response signals is identical to the stored signals, it is then concluded that the device under test has "passed". If the response signal does not match all of the stored signals, it is then concluded that the device under test has "failed".

An important aspect of the novel test procedure according to the present invention is that an asynchronous analog or digital frequency of the device under test 14 can be measured by the test computer 10, even though the typical ATE is specifically designed primarily to test digital waveforms. Further, it is not necessary to change, modify or add to the existing hardware of the ATE. Referring to FIG. 2, the first step 30 in the test procedure performed by the operating system is to create a pattern of test vectors. The number of necessary vectors per pattern to correctly identify a frequency of interest within a given accuracy is known to a person of ordinary skill. Next, in step 31 the start period is set, and the maximum number of counts is set as is the period increment. The number of counts would be selected by one of ordinary skill based on frequency range of interest and the size of the period increment.

$$\text{count} = \frac{\text{maximum } periodT \text{ [sec]} - \text{minimum } periodT \text{ [sec]}}{\text{increment [sec]}}$$

For example, in a search for a frequency between 16 Mhz and 20 Mhz, a period increment of 0.1 nanosecond will give a count of 125. This is shown in step 31. The next step 32 is to set the working periodT of the ATE. In step 34 the count is incremented by 1. In step 36 the count is compared to the maximum count number. Assume that the count is less than the maximum count number so that in step 38 the operating system presents test vectors to the integrated circuit. At step 40 the scan pattern received from the device under test 14 is compared against a pattern stored in the memory 20 as the test computer 10 scans periodT from the beginning of the periodT to the end of the periodT in predefined steps. If the two patterns are not identical, a "no" results causing the periodT adjustment, ie., step 42. As is seen, the periodT is adjusted by pre-determined amount, e.g. 0.1 nanosecond, and this result fed back to step 32 where the periodT is set again. This loop continues until one of two possible events occurs. Either the count reaches the maximum count setting as defined in step 36, or as defined in step 40, the pattern received back from the device under test 14 is identical to the pattern stored in the memory 20 of the test computer. In the former case, the test computer 10 has not been able to successfully match the test vectors returned from the integrated circuit under test 14 with the stored pattern, and a read out is provided indicating that test computer 10 "failed" to measure the test frequency. In the latter case the asynchronous frequency of interest has been identified and that frequency can be calculated according to the equation as follows.

$$periodT = ATE \text{ test period [sec]} \qquad periodX = periodT$$

$$periodX = \text{unknown period of the asynchronous frequency [sec]} \qquad fX = fT$$

$$fX, fT : \text{frequency [Hz]} \qquad fX = \frac{1}{periodT}$$

An important feature of the present invention is that the test computer 10 can measure a digital or analog asynchronous frequency of the device under test 14 which is a multiple of the ATE test frequency. First, a flow chart of the steps executed by the operating system 18 will now be described with respect to FIG. 3 to demonstrate how a frequency of twice the ATE test period is identified. As is seen in step 50, a pattern of test vectors is created with randomly assigned timing set per vector. Next, the maximum number of counts is set. It will be appreciated that the periodT for the first timing set of randomly assigned timing sets is TS1 is the same as for the second and other timing sets. Next as shown in step 56, the count is incremented by 1. Assume that the count is less than the maximum and the operating system 18 then executes the test vector patterns, as shown in step 60. Every vector has only one timing set TSn randomly assigned to that vector. During execution of the vector which has, let us say, TS1 assigned, tester will scan the first one half of the periodT for presence a particular signal fX. If the next vector has TS2 assigned then tester will scan second half of the periodT for presence of a signal fX.

Next the test computer 10 compares the patterns received from the integrated circuit under test to the known correct pattern in the memory 20. If the two patterns are not identical the comparison "fails" and the periodT for the timing sets are incremented by a predetermined amount as shown in step 64. This process continues until the pattern returned from the integrated circuit 14 under test matches the stored pattern, or a count out occurs. At this point the frequency of the asynchronous signal from the integrated circuit under test can be calculated according to the following formula.

$$periodT = ATE \text{ test period [sec]} \qquad fT = \frac{1}{periodT}$$

$$periodX = \text{unknown period of the asynchronous frequency [sec]} \qquad fX = 2 * fT$$

$$fX, fT : \text{frequency [Hz]} \qquad periodX = \frac{periodT}{2}$$

Referring next to FIG. 4, the test procedure for measuring an asynchronous frequency of three times the tester frequency will now be described. The first step 70 is to create the test pattern of test vectors with randomly assigned timing sets. Next, as is seen in step 72, the start periodT is defined, the maximum number of counts in the procedure is defined, and the periodT is set. Next in step 74, the periodT for the first timing set is set, the periodT for the second timing set is set and the periodT for the third timing set is set all of which periods are equal. Next, in the step 74, the count is incremented by one and in step 78 the count is compared to the maximum count to determine if it is still less than the maximum count. If this is still the case, the operating system 18 then executes the patterns of vectors as shown in step 80. Every vector has only one timing set TSn randomly assigned to that vector. During execution of the vector which has, let us say, TS1 assigned, tester will scan the first one third of the periodT for presence a signal fX. If the next vector has TS2 assigned then tester will scan second third of the periodT for presence of a signal fX. Finally, if the vector has timing set three assigned, then the tester will scan the last third of the periodT for the presence of a signal fX.

In conditional step 82 the test computer 10 compares the patterns received from the device under test to a known correct pattern which is stored in the memory 20. If the match is not identical, the comparison "fails" and the procedure branches back through step 84. In the step 84 the periodT for the timing step is adjusted by a predetermined amount. This branch leads back to step 74 where the timing periods for the first timing set, the second timing set and the third timing set are established. The computer 10 continues in loops until the pattern returned from the device under test matches the stored pattern resulting in read out of "passed". The frequency of the asynchronous wave form from the integrated circuit under test can be calculated according to the following formula.

$$periodT = ATE \text{ test period [sec]} \qquad fT = \frac{1}{periodT}$$

$$periodX = \text{unknown period of the asynchronous frequency [sec]} \qquad fX = 3 * fT$$

$$fX, fT : \text{frequency [Hz]} \qquad periodX = \frac{periodT}{3}$$

As previously mentioned also included in this test procedure is a "count out" function in step 78. If the test procedure has not been able to successfully match the test vectors returned from device under test against the stored patterns within the number of counts initially set at the beginning of the procedure, a branch through step 88 provides a readout indicating that the test is invalid and the frequency can not be measured.

Referring next to FIG. 5 the test procedure for measuring an asynchronous digital or analog frequency of four times the tester frequency will now be described. The first step 90 is to create a pattern of test vectors based on randomly assigned timing sets. Next in step 92 a set of conditions for the start periodT is established, the maximum count for the overall test procedure is set and the periodT increment for the frequency of interest related to the device under test 14 is set. In step 94 the start periodT for the first timing set is established, the start periodT for the second timing set is established, the start periodT for the third timing set is established and the start periodT for the fourth timing set is established. In step 96 the count is incremented by one and the count number is compared to the maximum number of counts set at the start of the program in the step 92. Assume that this conditional test demonstrates that the count is still less than the maximum count, the test computer 10 presents the test vectors to the device under test 14. Every vector has only one timing set TSn randomly assigned to that vector. During execution of the vector which has, let us say, TS1 assigned, tester will scan first one quarter of the periodT for presence a signal fX. If the next vector has TS2 assigned then tester will scan second quarter of the periodT for presence of a signal fX. If the next vector has TS3 assigned then the tester will scan the third quarter of the periodT for the presence of signal fX. Finally, if the next vector has TS4 assigned then the tester will scan the fourth quarter of the periodT for the presence of signal fX. Next, the test computer 10 then compares the patterns received from the integrated circuit under test 14 in step 102 to the known correct patterns in the memory 20. If the patterns are not identical, the comparison "fails" and the period is increased by the period increment as shown in step 104. The test computer 10 continues to execute according to this loop until either a match occurs or there is a count out. If the match is the first to occur, the frequency of the asynchronous signal from the integrated circuit under test 14 can be calculated according to the following formula.

$$periodT = ATE \text{ test period [sec]} \qquad fT = \frac{1}{periodT}$$

$$periodX = \text{unknown period of the asynchronous frequency [sec]} \qquad fX = 4 * fT$$

$$fX, fT : \text{frequency [Hz]} \qquad periodX = \frac{periodT}{4}$$

If the test computer 10 has not be able to successfully match the vectors returned from the device under test 14 with the stored pattern within the predetermined number of loop calculations as established by the initially set conditions, the count maximum is reached as shown in step 98 and a readout is provided as shown in step 106 indicating that the test computer failed to measure the frequency of interest.

Although the invention has been described with respect to a specific embodiment this description should not be construed in a limiting sense. For example, frequencies of greater than four times the tester frequency could be measured by modifying the procedure described above in a manner which would be well known to one of ordinary skill. Various modifications to the disclosed embodiment as well as alternative embodiments of the invention will become apparent to persons skilled in the art upon reference to the description of the invention.

What is claimed:

1. A test method for use by automated test equipment which includes a computer to measure the operation of an integrated circuit comprising of:

providing a database to a computer, said database including at least patterns of vectors known to represent good components;

assign randomly selected timing set to each vector;

creating a pattern of test vectors with randomly assigned timing sets, establish a count representing the maximum number of times a set of test vectors will be applied to a device under test;

presenting pattern of test vector to predeteremined ports of said integrated circuit;

sensing voltage waveform on a particular port of said integrated circuit port;

comparing said voltage waveform outputs of said stored patterns;

if there is no match adjusting the periodT of timing sets within selected measured frequency range by a predetermined increment until the scanned patterns match the stored patterns; and if there is a match calculating the asynchronous frequency of said device under test.

2. A test method for use by automated test equipment according to claim 1, wherein said predetermined increment by which said timing set are adjusted is 0.1 nanoseconds.

3. A test method for use by automated test equipment according to claim 1, wherein each vector has either a first randomly assigned timing set or a second randomly assigned timing set, and further including the step of presenting the first randomly assigned timing set to said unit under test during the first half of a scan period, and presenting said second timing randomly assigned timing set during the second half of a scan period, in any order.

4. A test method for use by automated test equipment according to claim 1, wherein each vector has a first randomly assigned timing set, a second randomly assigned timing set, and a third randomly assigned timing set, and further including the step of presenting either the first randomly assigned timing sets to said unit under test during the first third of a scan period, and presenting said second randomly assigned timing set during the second third of a scan period, and presenting said third randomly assigned timing set during the last third of a scan period, in any order.

5. A test method for use by automated test equipment according to claim 1, wherein each vector has a first timing randomly assigned timing sets, a second randomly assigned timing set, a third randomly assigned timing set, and a fourth randomly assigned timing set, and further including the step of presenting said first randomly assigned timing sets to said unit under test during the first forth of a scan period, and presenting said second randomly assigned timing set during the second forth of a scan period, and presenting said third randomly assigned timing set during the third forth of a scan period, and presenting said forth randomly assigned timing sets during the last forth of a scan period, in any order.

* * * * *